United States Patent
Ma et al.

(10) Patent No.: US 12,532,600 B2
(45) Date of Patent: Jan. 20, 2026

(54) NANOMATERIAL, PREPARATION METHOD THEREOF, AND QUANTUM DOT LIGHT-EMITTING DIODE

(71) Applicant: TCL TECHNOLOGY GROUP CORPORATION, Huizhou (CN)

(72) Inventors: Xingyuan Ma, Huizhou (CN); Wei Xu, Huizhou (CN); Jianxin Zhang, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 711 days.

(21) Appl. No.: 17/950,090

(22) Filed: Sep. 21, 2022

(65) Prior Publication Data
US 2023/0023531 A1    Jan. 26, 2023

Related U.S. Application Data

(63) Continuation of application No. PCT/CN2020/141155, filed on Dec. 30, 2020.

(30) Foreign Application Priority Data

Jul. 17, 2020    (CN) .......................... 202010692288.9

(51) Int. Cl.
H10K 50/115    (2023.01)
H10K 50/15    (2023.01)
H10K 85/00    (2023.01)

(52) U.S. Cl.
CPC ........... *H10K 50/115* (2023.02); *H10K 50/15* (2023.02); *H10K 85/00* (2023.02)

(58) Field of Classification Search
None
See application file for complete search history.

(56) References Cited

U.S. PATENT DOCUMENTS

| | | | |
|---|---|---|---|
| 8,323,772 B2 | 12/2012 | Lin | |
| 2011/0181958 A1 | 7/2011 | Lin | |
| 2015/0047417 A1 | 2/2015 | Park et al. | |
| 2018/0019371 A1 | 1/2018 | Steckel et al. | |
| 2020/0321547 A1* | 10/2020 | Wu | H10K 59/80 |
| 2023/0061360 A1* | 3/2023 | Kim | C09K 11/88 |

FOREIGN PATENT DOCUMENTS

| | | | | |
|---|---|---|---|---|
| CN | 108439456 A | 8/2018 | | |
| CN | 110526277 A | 12/2019 | | |
| CN | 110970579 A | 4/2020 | | |
| CN | 110993808 A | 4/2020 | | |
| CN | 113120949 A | * | 7/2021 | .............. C01G 9/02 |

OTHER PUBLICATIONS

Japan Patent Office (JPO) The Notice of Reasons for Refusal For JP Application No. 2022-555174 Aug. 29, 2023 11 Pages (Translation Included).
The World Intellectual Property Organization (WIPO) International Search Report for PCT/CN2020/141155 Apr. 19, 2021 6 Pages.
China National Intellectual Property Administration (CNIPA) 1st Examinaton Report of CN2020106922889 Jul. 20, 2022 8 Pages.

* cited by examiner

*Primary Examiner* — Michael Lebentritt
(74) *Attorney, Agent, or Firm* — ANOVA LAW GROUP, PLLC

(57) ABSTRACT

A nanomaterial includes a core and an outer shell. The core includes ZnO nanoparticles and a metal element doped in the ZnO nanoparticles. The outer shell includes a metal oxide.

20 Claims, 1 Drawing Sheet

---

Mix zinc salt and salt of the metal element that is to be doped with an alkaline solution to react to obtain the ZnO nanoparticle doped with the metal element — S10

Use a ZnO nanoparticle doped with the metal element as a core, and form a metal oxide shell on the surface of the core to obtain a nanomaterial with a core-shell structure — S20

NANOMATERIAL, PREPARATION METHOD THEREOF, AND QUANTUM DOT LIGHT-EMITTING DIODE

CROSS-REFERENCES TO RELATED APPLICATIONS

This application is a continuation of International Application No. PCT/CN2020/141155, filed Dec. 30, 2020, which claims priority to Chinese Application No. 202010692288.9, filed Jul. 17, 2020, the entire content of all of which are incorporated herein by reference.

TECHNICAL FIELD

The present disclosure generally relates to the quantum dot light-emitting device field and, more particularly, to a nanomaterial, a preparation method of the nanomaterial, and a quantum dot light-emitting diode.

BACKGROUND

The quantum dot electroluminescence display technology becomes a desired candidate for the next-generation display technology due to an adjustable wavelength, high color saturation, high material stability, and low manufacturing cost. After nearly two decades of development, external quantum efficiency of a quantum dot light-emitting diode (QLED) is increased from 0.01% to more than 20%. In terms of device efficiency, the QLED is quite close to an organic light-emitting diode (OLED). However, although a quantum dot device has the above-mentioned advantages, the performance of the current quantum dot device, especially for a blue QLED device, still does not meet the requirements of industrialization.

There is a need for a more reasonable device structure and energy level structure and a material system with better stability to further improving the efficiency and life of QLED devices.

SUMMARY

With the above-mentioned deficiencies of the existing technology, the purpose of the present disclosure is to provide a nanomaterial, a preparation method thereof, and a quantum dot light-emitting diode to solve the problems that the efficiency and life of the existing device still need to be improved.

Embodiments of the present disclosure provide a nanomaterial, including a core and an outer shell. The core includes ZnO nanoparticles and a metal element doped in the ZnO nanoparticles. The outer shell includes a metal oxide.

Embodiments of the present disclosure provide a preparation method of a nanomaterial. The method includes mixing zinc salt and salt of a to-be-doped metal element with an alkaline solution to react to obtain ZnO nanoparticles doped with the metal element, and using the ZnO nanoparticles doped with the metal element as a core and forming a metal oxide shell on a surface of the core to obtain the nanomaterial with a core-shell structure.

Embodiments of the present application provide a quantum dot light-emitting diode, including an anode, a cathode, a quantum dot light-emitting layer, and an electron transmission layer. The anode and the cathode are arranged oppositely to each other. The quantum dot light-emitting layer is arranged between the anode and the cathode. The electron transmission layer is arranged between the cathode and the quantum dot light-emitting layer. A material for forming the electron transmission layer includes a nanomaterial, including a core and an outer shell. The core includes ZnO nanoparticles and a metal element doped in the ZnO nanoparticles. The outer shell includes a metal oxide.

Embodiments of the present disclosure provide a quantum dot light-emitting diode, including an anode, a cathode, a quantum dot light-emitting layer, and an electron transmission layer. The anode and the cathode are arranged oppositely to each other. The quantum dot light-emitting layer is arranged between the anode and the cathode. The electron transmission layer is arranged between the cathode and the quantum dot light-emitting layer. A material for forming the electron transmission layer is prepared by mixing zinc salt and salt of a to-be-doped metal element with an alkaline solution to react to obtain ZnO nanoparticles doped with the metal element and using the ZnO nanoparticles doped with the metal element as a core and forming a metal oxide shell on a surface of the core to obtain the nanomaterial with a core-shell structure.

Beneficial effects include that, in the present disclosure, the energy level structure and electron transport efficiency of the overall nanomaterial may be adjusted by doping another metal element in zinc oxide nanoparticles and wrapping the core with the metal oxide shell. On one hand, by adjusting the energy level structure of the overall nanomaterial, the energy level of the nanomaterial (as the material of the electron transmission layer) in the quantum dot light-emitting diode may match with the energy level of the quantum dot better. The transfer of the electron in the quantum dot light-emitting layer toward the electron transmission layer may be reduced. The electron and hole recombination efficiency may be improved in the quantum dot light-emitting layer. Thus, the efficiency of the quantum dot light-emitting diode may be greatly improved. On the other hand, by adjusting the electron transmission efficiency of the overall nanomaterial, the electron injection and the hole injection of the dot light-emitting diode may be more balanced, the charge accumulation of the quantum dot light-emitting layer may be reduced, the Auger recombination may be suppressed, and the radiative recombination efficiency of the electron and hole may be improved. Thus, the efficiency of the quantum dot light-emitting diode may be greatly improved. In addition, in the present disclosure, by wrapping a metal oxide shell on the surface of the doped ZnO nanoparticles, the zinc oxide nanoparticles may be more stable, and the stability of the quantum dot light-emitting diode may be improved. Thus, the life of the quantum dot light-emitting diode may be greatly prolonged.

DETAILED DESCRIPTION OF THE EMBODIMENTS

Figure 1:
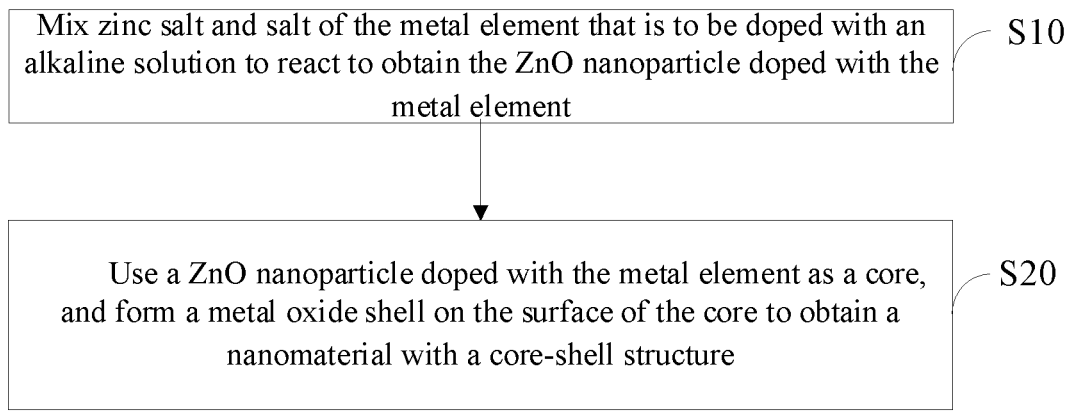
FIG. 1 is a schematic flowchart of a preparation method of a nanomaterial according to some embodiments of the present disclosure.

The present disclosure provides a nanomaterial, a preparation method of the nanomaterial, and a quantum dot light-emitting diode. In order to make the objectives, technical solutions, and effects of the present disclosure clearer, the present disclosure is further described in detail below. Embodiments described here are only used to explain the present disclosure, but not to limit the present disclosure.

A QLED device structure may be similar to an OLED device structure. A sandwich structure like a p-i-n junction is formed by a hole injection layer, a hole transmission layer, a light-emitting layer, and an electron transmission layer. By balancing the injection of electrons and holes, high-efficiency of the light-emitting may be achieved. Since a bandgap of a blue quantum dot is wider than band gaps of red and green quantum dots, electrons and holes may be injected more difficultly. Thus, a start voltage may be further increased, and interface charge accumulation may be more serious, which has a great impact on the life and efficiency of the device. Charges may be transmitted at an interface between zinc oxide (ZnO) and quantum dots, and the quantum dots have a lower binding ability for the electrons than for the holes, which causes a serious charge transmission phenomenon at the interface between ZnO and quantum dots. The charge transmission may become more severe as a conduction band energy level of the blue quantum dot increases. Transmission of excited electrons between interfaces may cause the charge accumulation at the interface and also greatly increases a probability of non-radiative Auger recombination, which significantly affects the efficiency and life of the device.

From an analysis of the device structure, factors affecting the efficiency and life of the QLED device mainly include the following aspects.

1. An energy level difference between the electrode and the hole injection layer (HIL) or corrosion of the electrode caused by the hole injection layer, such as interface damage caused by the corrosion of the electrode caused by PEDOT:PSS (poly3,4-ethylenedioxythiophene:polystyrene sulfonate), the charge accumulation, and increment of injection barrier.
2. A highest occupied molecular orbital (HOMO) energy level difference between a HIL and a hole transmission layer (HTL), i.e., a magnitude of the barrier between the HIL and the HTL.
3. A barrier magnitude at the interface between the HTL and the quantum dots and the resulting charge accumulation, such as poly [9, 9-dioctylfluorene-co-N-(4-(3-methylpropyl)) diphenylamine] (TFB) degradation due to the electron accumulation at the TFB/quantum dot interface, which causes a device failure.
4. A complex interaction between the quantum dot and ZnO layer, including the energy level difference at the quantum dot/ZnO interface, exciton transfer, and electron transfer. The interaction is closely related to oxygen vacancy concentration, conduction band position, and electron transport rate in ZnO, which have certain changes during a storage aging process of the device.
5. ZnO and cathode. A reaction between ZnO and a metal of the cathode produces a metal oxide, which increases the interface barrier, also increases the oxygen vacancy concentration of ZnO, and improves the conductivity of ZnO.

In addition, the light-emitting efficiency of the QLED device is also an important factor of affecting the device efficiency. With a reasonable optical structure design, the monochromaticity and the light-emitting intensity may be improved.

Embodiments of the present disclosure provide a nanomaterial. The nanomaterial may have a core-shell structure.

A core of the nanomaterial may include a zinc oxide (ZnO) nanoparticles and a metal element doped in the ZnO nanoparticles.

An outer shell of the nanomaterial may include a metal oxide.

In some embodiments, the core of the nanomaterial may include the ZnO nanoparticles and the metal element doped in the ZnO nanoparticles.

The outer shell of the nanomaterial may be the metal oxide.

In embodiments of the present disclosure, the ZnO nanoparticles may be improved. In some embodiments, the ZnO nanoparticles may be doped with other metal elements (such as aluminum, magnesium, lithium, etc.). The ZnO nanoparticles may be wrapped with a layer of a metal oxide shell (such as aluminum oxide, magnesium oxide, lithium oxide, etc.). Since conduction band energy levels of the oxide doped with the metal and the outer shell metal oxide are higher than a conduction band energy level of zinc oxide, a conduction band energy level of the overall nanomaterial may be improved. Thus, the conduction band energy level of the nanomaterial may match energy level structures of different quantum dots to reduce the transfer of the electrons in the quantum dot light-emitting layer toward the electron transmission layer and improve the electron-hole recombination efficiency in the quantum dot light-emitting layer. Therefore, the efficiency of the quantum dot light-emitting diode may be greatly improved. Even for the blue quantum dot, since the blue quantum dot has the higher conduction band energy level (green quantum dot having the conduction band energy level higher than the conduction band energy level of the red quantum dot, and blue quantum dot having the conduction band energy level higher than the conduction band energy level of the green quantum dot), the corresponding ZnO nanoparticles that are adopted may be required to have a relatively high conduction band energy level. The nanomaterial described in embodiments of the present disclosure may also match the energy level structure of the blue quantum dot.

In addition, in embodiments of the present disclosure, by doping the zinc oxide nanoparticles with different metal elements, adjusting a doping ratio, and adjusting a thickness of the metal oxide shell, the electron transmission rate of the overall nanomaterial may be adjusted. Thus, the injection of the electrons and the holes may be more balanced in the quantum dot light-emitting diode to improve the radiation recombination efficiency of the electrons and the holes. Therefore, the efficiency of the quantum dot light-emitting diode may be greatly improved. Regarding doping with different metal elements, when doping metal elements such as Mg, Ca, Li, etc., since band gaps and resistances of the metal oxide such as the magnesium oxide, the calcium oxide, and the lithium oxide are relatively large, doping the metal elements such as Mg, Ca, Li, etc. may reduce the conductivity of the ZnO nanoparticles. When doping the metal elements such as Ga and In, Ga and In are metal elements of a third main group, Ga and In may have a valence electron and may provide extra electrons. Moreover, band gaps of a gallium oxide and an indium oxide may be small, and conductivity of the gallium oxide and the indium oxide may be relatively good. Therefore, doping Ga, In, etc. may improve the conductivity of the zinc oxide nanoparticles. By adjusting the doping ratio, the change of the conductivity may be adjusted. The greater the doping ratio is, the greater the change of the conductivity is. Regarding the adjustment of the thickness of the metal oxide shell, when a shell material is a metal oxide such as magnesium oxide and aluminum oxide. Since the resistance of the metal oxide such as the magnesium oxide and the aluminum oxide is relatively large, the thicker the outer shell layer is, the worse the conductivity of the overall nanomaterial is. When the outer shell material is a metal oxide such as the indium oxide, since the resistance of the metal oxide such as the indium oxide is small, the thicker the outer shell layer is, the better the conductivity of the overall nanomaterial is.

For a quantum dot with a shorter light-emitting wavelength (light-emitting wavelengths of red, green, and blue QUANTUM DOTs becoming shorter and shorter), a metal (such as Mg, Ca, Li, etc.) with a larger oxide band gap may be selected to be doped. The doping ratio may be appropriately increased, and the thickness of the outer shell layer may be increased to enlarge the bandgap of the ZnO to cause the energy level of the ZnO to match the energy level of the QUANTUM DOT to maximize the performance of the device.

In addition, since a layer of the metal oxide is coated on a surface of the zinc oxide nanoparticles, the electron transmission stability of the ZnO nanoparticles may be greatly improved. Thus, the stability of the quantum dot light-emitting diode may be improved to improve the life of the quantum dot light-emitting diode.

In some embodiments, the metal element doped in the ZnO nanoparticles may include, but is not limited to, at least one of Al, Mg, Li, Ca, Ga, or In.

In some embodiments, the metal element in the metal oxide may include, but is not limited to, at least one of Al, Mg, Li, Ca, Ga, or In.

The metal element doped in the ZnO nanoparticles and the metal element in the metal oxide may be selected from a same material selection scope. In some embodiments, the metal elements doped in the ZnO nanoparticles and the metal element in the metal oxide may be selected from a same metal element or different metal elements.

In some embodiments, the metal element doped in the ZnO nanoparticles may be the same as the metal element in the metal oxide. As such, lattice mismatch between the outer shell and the core may be reduced to improve the stability of the nanomaterial.

In some embodiments, the metal element doped in the ZnO nanoparticles and the metal element in the metal oxide may be Mg or Li. Mg or Li oxide may have wider band gaps. Doping the metal element in the ZnO nanoparticles and wrapping the ZnO particle with the oxide shell of the metal may further increase the conduction band energy level of the ZnO nanoparticles to make the conduction band energy level to be more compatible with an energy level structure of a short-wavelength quantum dot.

In one embodiment, a ratio of a molar amount of the doped metal element to a total molar amount of the doped metal element and the zinc element may range from 0.5% to 30%. When the ratio of the doped metal is too high, lattice distortion of the nanoparticles may be too large, and structural instability may not be good.

In some embodiments, a thickness of the outer shell may range from 0.5 nm to 2 nm.

FIG. 1 is a schematic flowchart of a preparation method of a nanomaterial according to some embodiments of the present disclosure. The method includes the following steps.

At S10, zinc salt and salt of the to-be-doped metal element are mixed with an alkaline solution to react to obtain the ZnO nanoparticles doped with the metal element.

At S20, ZnO nanoparticles doped with the metal element is used as a core, and a metal oxide shell is formed on the surface of the core to obtain a nanomaterial with a core-shell structure.

The nanomaterial prepared by the method of embodiments of the present disclosure may be the nanomaterial described above. Thus, the nanomaterial prepared by the method may have all the features and advantages of the nanomaterial described above, which is not repeated here.

In some embodiments, using the ZnO nanoparticles doped with the metal element as the core and forming the metal oxide shell on the surface of the core to obtain a nanomaterial with the core-shell structure includes:

doping a metal salt in a reaction system of the ZnO nanoparticles doped with the metal element obtained to react to obtain the metal oxide shell on the surface of the core of the ZnO nanoparticles doped with the metal element to obtain the nanomaterial having the core-shell structure.

In some embodiments, the zinc salt may be a soluble inorganic zinc salt or a soluble organic zinc salt. For example, the zinc salt may include, but is not limited to, at least one of zinc acetate, zinc nitrate, zinc chloride, zinc sulfate, or zinc acetate dihydrate.

In embodiments of the present disclosure, the alkaline solution may be prepared by dissolving an alkali in an organic solvent. In some embodiments, the organic solvent may include, but is not limited to, at least one of 2-methoxyethanol, methanol, ethanol, isopropanol, or dimethyl sulfoxide.

In some embodiments, the salt of the to-be-doped metal element may include one or more of Al salt, Mg salt, Li salt, Ca salt, Ga salt, or In salt.

In some embodiments, the metal element in the metal oxide may include, but is not limited to, one or more of Al, Mg, Li, Ca, Ga, or In.

In some embodiments, the alkaline may include, but is not limited to, one or more of potassium hydroxide, sodium hydroxide, or tetramethylammonium hydroxide.

In some embodiments, a temperature at which the reaction treatment is performed may range from 20 to 150° C. Further, the temperature for performing the reaction treatment may range from 60 to 90° C.

In some embodiments, time for performing the reaction treatment may range from 1 to 10 h. Further, the time for performing the reaction treatment may range from 2 to 4 h.

Embodiments of the present disclosure provide a quantum dot light-emitting diode. The quantum dot light-emitting diode may include an anode, a cathode, a quantum dot light-emitting layer, and an electron transmission layer. The anode and the cathode may be arranged oppositely to each other. The quantum dot light-emitting layer may be arranged between the anode and the cathode. The electron transmission layer may be arranged between the cathode and the quantum dot light-emitting layer. A material forming the electron transmission layer may include the nanomaterials described above or the nanomaterial prepared by the preparation method described above.

In some embodiments, the material for forming the electron transmission layer of the quantum dot light-emitting diode may include the nanomaterial of embodiments of the present disclosure or the nanomaterial prepared by the preparation method of embodiments of the present disclosure.

Figure 2:
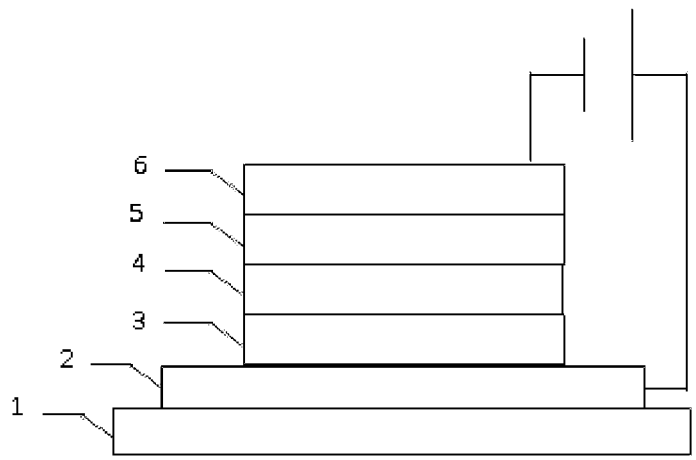
FIG. 2 is a schematic structural diagram of a quantum dot light-emitting diode according to some embodiments of the present disclosure.

In some embodiments, the quantum dot light-emitting diode may have a plurality of forms. The quantum dot light-emitting diode may be divided into a positive structure and an inversion structure. In embodiments of the present disclosure, the quantum dot light-emitting diode with the positive structure shown in FIG. 2 is described in detail. Take an example for a detailed introduction. In some embodiments, as shown in FIG. 2, the quantum dot light-emitting diode includes a substrate 1, an anode 2, a hole transmission layer 3, a quantum dot light-emitting layer 4, an electron transmission layer 5, and a cathode 6 stacked from bottom to top. A material of the electron transmission layer 5 may be the nanomaterial. The core of the nanomaterial may include ZnO nanoparticles and the metal element doped in the ZnO nanoparticles.

The outer shell of the nanomaterial may include the metal oxide.

In some embodiments, a thickness of the electron transmission layer may range from 20 to 60 nm.

In some embodiments, the substrate may be a substrate with a rigid material, such as glass, or a substrate with a flexible material, such as one of polyethylene terephthalate (PET) or polyimide (PI).

In some embodiments, a material of the anode may be selected from at least one of indium-doped tin oxide (ITO), fluorine-doped tin oxide (FTO), antimony-doped tin oxide (ATO), or aluminum-doped zinc oxide (AZO).

In some embodiments, a material of the hole transmission layer may be selected from a material with a good hole transmission property, such as but not limited to at least one of Poly(9,9-dioctylfluorene-CO-N-(4-butylphenyl)diphenylamine) (TFB), polyvinylcarbazole (PVK), Poly(N,N'bis (4-butylphenyl)-N,N'-bis(phenyl)benzidine) (Poly-TPD), 4,4',4"-Tris(carbazol-9-yl)triphenylamine (TCTA), Poly(3, 4-ethylenedioxythiophene)-poly(styrenesulfonic acid) (PEDOT:PSS), 4,4'-bis(9-carbazole)biphenyl (CBP), NiO, or $MoO_3$.

In some embodiments, the material of the quantum dot light-emitting layer may include an oil-soluble quantum dot. The oil-soluble quantum dot may include at least one of a binary phase quantum dot, a ternary phase quantum dot, or a quaternary phase quantum dot. The binary phase quantum dot may include at least one of CdS, CdSe, CdTe, InP, AgS, PbS, PbSe, or HgS. The ternary phase quantum dot may include at least one of ZnCdS, CuInS, ZnCdSe, ZnSeS, ZnCdTe, or PbSeS. The quaternary phase quantum dot may include at least one of ZnCdS/ZnSe, CuInS/ZnS, ZnCdSe/ZnS, CuInSeS, ZnCdTe/ZnS, or PbSeS/ZnS. The material of the quantum dot light-emitting layer may include any one of the common red, green, and blue quantum dots or another yellow light. The quantum dot may include cadmium or may be cadmium-free. The quantum dot light-emitting layer of the material may have characteristics that an excitation spectrum is wide and continuously distributed, and an emission spectrum has high stability. In some embodiments, the thickness of the quantum dot light-emitting layer may range from 20 to 60 nm.

In some embodiments, the cathode may be selected from one of an aluminum (Al) electrode, a silver (Ag) electrode, and a gold (Au) electrode. The cathode may also be selected from one of a nano-aluminum wire, a nano-silver wire, and a nano-gold wire. The material may have relatively low resistance, so that a carrier may be injected smoothly. In some embodiments, a thickness of the cathode may range from 15 to 30 nm.

The quantum dot light-emitting diode of the present disclosure may also include at least one of the following function layers, such as a hole injection layer arranged between the hole transmission layer and the anode or an electron injection layer arranged between the electron transmission layer and the cathode.

Embodiments of the present disclosure also provide a preparation method of a quantum dot light-emitting diode with a positive structure. The method may include the following steps.

A hole transmission layer may be formed on a substrate.

A quantum dot light-emitting layer may be formed on the hole transmission layer.

An electron transmission layer may be formed on the quantum dot light-emitting layer. A material of the electron transmission layer may include a nanomaterial. A core of the nanomaterial may include ZnO nanoparticles and a metal element doped in the ZnO nanoparticles. The outer shell of the nanomaterial may include a metal oxide.

A cathode may be formed on the electron transmission layer to obtain the quantum dot light-emitting diode.

In some embodiments, in order to obtain a hole transmission layer with high quality, the anode may need a pretreatment process. The pretreatment process may include cleaning the anode with a detergent to preliminarily remove a stain existing on the surface of the anode, ultrasonically cleaning the anode in deionized water, acetone, anhydrous ethanol, and deionized water for 20 minutes to remove the existing stain on the surface, and drying the anode with high-purity nitrogen to obtain the anode.

In some embodiments, forming the hole transmission layer on the substrate may include placing the substrate on a glue spinner, spin-coating a prepared solution of a hole transmission material to form a film, controlling a thickness of the film by adjusting the concentration of the solution, a spin-coating speed, and spin-coating time, and thermal annealing at an appropriate temperature to obtain the hole transmission layer.

In some embodiments, forming the quantum dot light-emitting layer on the hole transmission layer may include placing the substrate formed with the hole transmission layer on the glue spinner, spin-coating a prepared light-emitting substance solution with a certain concentration to form a film, controlling a thickness of the quantum dot light-emitting layer by adjusting a concentration of the solution, the spin-coating speed, and the spin-coating time, and drying the substrate at an appropriate temperature to obtain the quantum dot light-emitting layer.

In some embodiments, forming the electron transmission layer on the quantum dot light-emitting layer may include placing the substrate formed with the quantum dot light-emitting layer on the glue spinner, spin-coating the prepared electron transmission material solution with a certain concentration to form a film, controlling a thickness of the electron transmission layer by adjusting the concentration of the solution, the spin coating speed (e.g., between 3000 and 5000 rpm), and the spin coating time, and annealing to form a film to obtain the electron transmission layer. The substrate may be annealed in air or in nitrogen, which may be selected according to actual needs.

In some embodiments, the obtained quantum dot light-emitting diode may be packaged. The quantum dot light-emitting diode may be packaged by a commonly used machine or manually. In some embodiments, in an environment of a packaging process, an oxygen content and a water content may both be lower than 0.1 ppm to ensure the stability of the device.

In some embodiments, the preparation methods of the layers may include a chemical method or a physical method. The chemical method includes but is not limited to at least one of a chemical vapor deposition method, a continuous ion layer adsorption and reaction method, an anode oxidation method, an electrodeposition method, or a co-precipitation method. The physical method may include, but is not limited to, at least one of a solution method (such as a spin-coating method, a printing method, a blade coating method, a dip-pulling method, an immersion method, a spraying method, a roll coating method, a casting method, a slot coating method, or a strip coating method), an evaporation method (such as a thermal evaporation method, an electron beam evaporation method, a magnetron sputtering method, or a multi-arc ion coating method), or a deposition method (such as a physical vapor deposition method, an element layer deposition method, or a pulse laser deposition method).

An example according to some embodiments of the present disclosure is described in detail below.

EXAMPLE

1. Preparation of Nanomaterial
   1) 10 mmol of tetramethylamine hydroxide was added to 30 ml of 2-methoxyethanol and heated in a water bath for 20 min.
   2) 6 mmol of zinc acetate and 2 mmol of aluminum acetate were added and stirred for 3 hours to obtain a clear solution to obtain an aluminum-doped zinc oxide nanoparticles.
   3) 2 mmol of aluminum acetate is added, ultrasonication was performed for 45 min with pause for 5s every 2 min, and the nanoparticles were wrapped with a shell layer to obtain the nanomaterial with a core-shell structure.
   4) the obtained nanomaterial was washed with ethyl acetate and ethanol, and finally the nanomaterial was dissolved in the ethanol solution.
2. Preparation of Quantum Dot Light-Emitting Diode
   1) ITO was evaporated on a substrate as a first electrode with a thickness of 40 nm and then was cleaned with ultraviolet light ozone (UVO) for 15 min. A surface infiltration degree was improved during surface cleaning.
   2) a layer of PEDOT:PSS was spin-coated on the ITO as a hole injection layer. The spin-coating speed was 5000 rpm, and the spin-coating time was 40 s. Annealing was performed at 150° C. for 15 min. The whole step was performed in air.
   3) a layer of TFB was spin-coated on PEDOT:PSS as a hole transmission layer. TFB was dissolved in chlorobenzene with a concentration of 8 mg/ml. The spin-coating speed was 3000 rpm, and the spin-coating time was 30 s. The substrate was then heated at 150° C. for 30 min. This step was performed in a glove box.
   4) a quantum dot light-emitting layer was spin-coated on TFB. The quantum dot was dissolved in n-octane with a concentration of 20 mg/ml. A spin-coating speed was 2000 rpm, and the spin-coating time was 30 s. Then, the substrate was heated at 100° C. for 20 min. This step was performed in the glove box.
   5) the prepared nanomaterial was spin-coated on the quantum dot light-emitting layer as the electron transmission layer. The nanomaterial was dissolved in ethanol with a concentration of 30 mg/ml. The spin-coating speed was 3000 rpm, and the spin-coating time was 30 s. Then, the substrate was heated at 100° C. for 30 min. This step was performed in the glove box.
   6) a layer of Al was evaporated on the electron transmission layer as the second electrode with a thickness of the Al electrode of 100 nm.

Comparative Example

The nanomaterial was replaced with a pure zinc oxide nanoparticles, and other steps remain the same.

The performances of the quantum dot light-emitting diodes of the example and the comparative example were tested, respectively. The test results are shown in Table 1.

TABLE 1

Efficiency and life of quantum dot light-emitting diodes

| Project group | External quantum dot efficiency (EQE) | T95 (1000 nit) |
| --- | --- | --- |
| Example | 22.3% | 8500 h |
| Comparative Example | 15.2% | 3530 h |

T95 (1000 nit) in the table represents time that a device needs to degrade to 95% at 1000 nit brightness.

As seen in Table 1, after using the nanomaterial prepared in the example, the efficiency and life of the device have been significantly improved. Especially, the device efficiency has reached a highest value of a theoretical efficiency, and the life has also increased by two times or more.

In summary, the present disclosure provides a nanomaterial, a preparation method thereof, and a quantum dot light-emitting diode. In the present disclosure, the nanomaterial is prepared by a simple sol-gel method and used as the electron transmission layer material of the device. In the present disclosure, by doping zinc oxide nanoparticles with another metal element and wrapping the nanoparticles with a metal oxide shell, the energy level structure and electron transmission efficiency of the overall nanomaterial may be adjusted. Thus, the energy level of the quantum dot may match the energy level of the nanomaterial better in the device. The transfer of the electrons in the quantum dot light-emitting layer toward the electron transmission layer may be reduced. The electron-hole recombination efficiency of the quantum dot light-emitting layer may be improved. Therefore, the electron and hole injection of the device may be more balanced, the charge accumulation of the quantum dot light-emitting layer may be reduced, the Auger recombination may be restricted, and the radiation recombination efficiency of the electrons and the holes may be improved. As such, the zinc oxide nanoparticles may be more stable, and the overall stability of the device may be improved.

An application of the present disclosure is not limited to the above examples. For those of ordinary skill in the art, improvements or transformations may be made according to the above descriptions. All these improvements and transformations should be within the scope of the appended claims of the present invention.

What is claimed is:

1. A nanomaterial comprising:
   a core including:
      ZnO nanoparticles; and
      a metal element doped in the ZnO nanoparticles; and
   an outer shell including a metal oxide,
   wherein the metal element doped in the ZnO nanoparticles includes at least one of Al, Li, Ca, Ga, or In.
2. The nanomaterial according to claim 1, wherein:
   a metal element in the metal oxide includes at least one of Al, Mg, Li, Ca, Ga, or In.

3. The nanomaterial according to claim 1, wherein the metal element doped in the ZnO nanoparticles is the same as a metal element in the metal oxide.

4. The nanomaterial according to claim 1, wherein a ratio of a molar amount of the doped metal element to a total molar amount of the doped metal element and a zinc element ranges from 0.5% to 30%.

5. The nanomaterial according to claim 1, wherein a thickness of the outer shell ranges from 0.5 to 2 nm.

6. The nanomaterial according to claim 1, wherein the metal element doped in the ZnO nanoparticles and a metal element in the metal oxide are both Li.

7. The nanomaterial according to claim 1, wherein:
the core of the nanomaterial consists of the ZnO nanoparticles and the metal element doped in the ZnO nanoparticles; and
the outer shell of the nanomaterial includes the metal oxide.

8. A preparation method of a nanomaterial comprising:
mixing a zinc salt and a salt of a to-be-doped metal element with an alkaline solution for a reaction to obtain ZnO nanoparticles doped with the metal element; and
using the ZnO nanoparticles doped with the metal element as a core and forming a metal oxide shell on a surface of the core to obtain the nanomaterial with a core-shell structure,
wherein the salt of the metal element that is to be doped includes at least one of Al salt, Li salt, Ca salt, Ga salt, or In salt;.

9. The method according to claim 8, wherein using the ZnO nanoparticles doped with the metal element as the core and forming the metal oxide shell on the surface of the core to obtain the nanomaterial with the core-shell structure includes:
adding a metal salt to a reaction system for obtaining the ZnO nanoparticles doped with the metal element, to obtain the metal oxide shell on the surface of the core of the ZnO nanoparticles doped with the metal element to obtain the nanomaterial with the core-shell structure.

10. The method according to claim 8, wherein:
the zinc salt includes at least one of zinc acetate, zinc nitrate, zinc chloride, zinc sulfate, or zinc acetate dihydrate; and/or
a metal element in the metal oxide includes at least one of Al, Mg, Li, Ca, Ga, or In; and/or
alkali in the alkaline solution includes at least one of potassium hydroxide, sodium hydroxide, or tetramethylammonium hydroxide.

11. The method according to claim 8, wherein the metal element doped in the ZnO nanoparticles is the same as a metal element in the metal oxide.

12. The method according to claim 8, wherein a ratio of a molar amount of the doped metal element to a total molar amount of the doped metal element and a zinc element ranges from 0.5% to 30%.

13. The method according to claim 8, wherein a thickness of the outer shell ranges from 0.5 to 2 nm.

14. The method according to claim 8, wherein the metal element doped in the ZnO nanoparticles and a metal element in the metal oxide are both Li.

15. A quantum dot light-emitting diode comprising:
an anode and a cathode arranged oppositely to each other;
a quantum dot light-emitting layer arranged between the anode and the cathode; and
an electron transmission layer arranged between the cathode and the quantum dot light-emitting layer, wherein a material for forming the electron transmission layer includes a nanomaterial, the nanomaterial including:
a core including:
ZnO nanoparticles; and
a metal element doped in the ZnO nanoparticles; and
an outer shell including a metal oxide,
wherein the metal element doped in the ZnO nanoparticles includes at least one of Al, Li, Ca, Ga, or In.

16. The quantum dot light-emitting diode according to claim 15, wherein a material for forming the electron transmission layer is the nanomaterial.

17. The quantum dot light-emitting diode according to claim 15, further comprising:
a hole transmission layer arranged between the anode and the quantum dot light-emitting layer.

18. The quantum dot light-emitting diode according to claim 15, wherein a thickness of the electron transmission layer ranges from 20 to 60 nm.

19. The method according to claim 1, further comprising:
preparing the alkaline solution by dissolving an alkali in an organic solvent, the organic solvent being at least one of 2-methoxyethanol, methanol, ethanol, isopropanol, or dimethyl sulfoxide.

20. The nanomaterial according to claim 1, wherein the metal element doped in the ZnO nanoparticles is Li.

* * * * *